(12) United States Patent
Lee

(10) Patent No.: US 9,540,232 B2
(45) Date of Patent: Jan. 10, 2017

(54) METHOD AND STRUCTURE OF MEMS WLCSP FABRICATION

(71) Applicant: mCube Inc., San Jose, CA (US)

(72) Inventor: Chien Chen Lee, San Jose, CA (US)

(73) Assignee: mCube Inc., San Jose, CA (US)

( * ) Notice: Subject to any disclaimer, the term of this patent is extended or adjusted under 35 U.S.C. 154(b) by 0 days.

(21) Appl. No.: 14/507,177

(22) Filed: Oct. 6, 2014

(65) Prior Publication Data

US 2015/0166330 A1 Jun. 18, 2015

Related U.S. Application Data

(60) Provisional application No. 61/887,214, filed on Oct. 4, 2013.

(51) Int. Cl.
*B81C 1/00* (2006.01)

(52) U.S. Cl.
CPC .... *B81C 1/00301* (2013.01); *B81B 2201/0235* (2013.01); *B81B 2201/0242* (2013.01); *B81B 2201/0257* (2013.01); *B81B 2201/0264* (2013.01); *B81C 2203/0109* (2013.01); *B81C 2203/0154* (2013.01)

(58) Field of Classification Search
CPC ..................... B82B 3/0086; B82B 2201/0235; B81C 1/00801; B81C 1/00301
USPC ....................................................... 257/416
See application file for complete search history.

(56) References Cited

U.S. PATENT DOCUMENTS 3,614,677 A 10/1971 Wilfinger
5,736,732 A 4/1998 Possin et al.
5,825,385 A 10/1998 Silverbrook
7,595,209 B1 9/2009 Monadgemi et al.
8,164,171 B2 * 4/2012 Lin ................... H01L 23/49816
 257/685
8,181,874 B1 5/2012 Wan et al.
8,205,498 B2 6/2012 Hsu et al.
8,227,285 B1 7/2012 Yang
8,236,577 B1 8/2012 Hsu et al.
8,245,923 B1 8/2012 Merrill et al.
8,324,047 B1 12/2012 Yang
8,367,522 B1 2/2013 Yang
8,395,252 B1 3/2013 Yang (Continued)

FOREIGN PATENT DOCUMENTS

WO WO2010092399 A2 8/2010

*Primary Examiner* — Nathan W Ha

(74) *Attorney, Agent, or Firm* — Kilpatrick Townsend and Stockton LLP

(57) ABSTRACT

A method for fabricating a MEMS-IC device structure can include receiving a CMOS substrate comprising a plurality of CMOS circuits and a surface portion. A MEMS substrate having at least one MEMS device can be received and coupled to the CMOS substrate. The MEMS substrate and the surface portion of the CMOS substrate can be encapsulated with a molding material, which forms a top surface. A first plurality of vias can be created in the molding material from the top surface to the surface portion of the CMOS substrate. A conductive material can be disposed within the first plurality of vias such that the conductive material is electrically coupled to a portion of the CMOS substrate. A plurality of interconnects can be formed from the conductive material to the top surface of the molding material and a plurality of solder balls can be formed upon these interconnects.

14 Claims, 10 Drawing Sheets

(56) References Cited

U.S. PATENT DOCUMENTS

| | | |
|---|---|---|
| 8,402,666 B1 | 3/2013 | Hsu et al. |
| 8,407,905 B1 | 4/2013 | Hsu et al. |
| 8,421,082 B1 * | 4/2013 | Yang .................. B81C 1/00246 |
| | | 257/288 |
| 8,432,005 B2 | 4/2013 | Yang |
| 8,432,007 B2 * | 4/2013 | Leidl .................... B81B 7/0064 |
| | | 257/416 |
| 8,476,084 B1 | 7/2013 | Yang et al. |
| 8,476,129 B1 | 7/2013 | Jensen et al. |
| 8,477,473 B1 | 7/2013 | Koury et al. |
| 8,486,723 B1 | 7/2013 | Wan |
| 8,516,886 B2 | 8/2013 | Acar et al. |
| 8,553,389 B1 | 10/2013 | Koury et al. |
| 8,584,521 B1 | 11/2013 | Yang |
| 8,592,993 B2 | 11/2013 | Yang |
| 8,637,943 B1 | 1/2014 | Yang |
| 8,643,612 B2 | 2/2014 | Yang |
| 8,652,961 B1 | 2/2014 | Yang |
| 8,723,986 B1 | 5/2014 | Merrill |
| 8,742,520 B2 | 6/2014 | Wan et al. |
| 8,749,004 B2 | 6/2014 | Yang |
| 8,794,065 B1 | 8/2014 | Yang |
| 8,797,279 B2 | 8/2014 | Yang |
| 8,869,616 B1 | 10/2014 | Sridharamurthy et al. |
| 8,878,312 B2 | 11/2014 | Hung et al. |
| 8,928,602 B1 | 1/2015 | Wan |
| 8,928,696 B1 | 1/2015 | Yang |
| 8,936,959 B1 | 1/2015 | Yang |
| 8,969,101 B1 | 3/2015 | Wan |
| 8,981,560 B2 | 3/2015 | Jensen et al. |
| 8,993,362 B1 | 3/2015 | Flannery |
| 9,150,406 B2 | 10/2015 | Yang |
| 9,276,080 B2 * | 3/2016 | Sridharamurthy  H01L 29/66007 |
| 2003/0196490 A1 | 10/2003 | Cardarelli |
| 2004/0227201 A1 | 11/2004 | Borwick et al. |
| 2005/0252293 A1 | 11/2005 | Won et al. |
| 2006/0049826 A1 | 3/2006 | Daneman et al. |
| 2007/0181962 A1 | 8/2007 | Partridge et al. |
| 2007/0281379 A1 * | 12/2007 | Stark .................... B81B 3/0021 |
| | | 438/50 |
| 2008/0014682 A1 | 1/2008 | Yang et al. |
| 2009/0309203 A1 | 12/2009 | Seppala et al. |
| 2010/0071467 A1 | 3/2010 | Nasiri et al. |
| 2010/0083756 A1 | 4/2010 | Merz et al. |
| 2010/0236327 A1 | 9/2010 | Mao |
| 2011/0030473 A1 | 2/2011 | Acar |
| 2011/0031565 A1 * | 2/2011 | Marx ...................... G01C 19/5712 |
| | | 257/417 |
| 2011/0121416 A1 * | 5/2011 | Quevy ...................... B81B 7/02 |
| | | 257/417 |
| 2011/0154905 A1 | 6/2011 | Hsu et al. |
| 2012/0012970 A1 | 1/2012 | Xu et al. |
| 2012/0223726 A1 | 9/2012 | Zhang et al. |
| 2012/0248506 A1 * | 10/2012 | Yang ...................... H01L 22/12 |
| | | 257/254 |
| 2012/0248615 A1 * | 10/2012 | Chien .................... B81C 1/0023 |
| | | 257/770 |
| 2013/0042686 A1 | 2/2013 | Lin et al. |
| 2013/0082338 A1 | 4/2013 | Pan et al. |
| 2013/0247662 A1 | 9/2013 | Jin et al. |
| 2013/0247666 A1 | 9/2013 | Acar |
| 2013/0328139 A1 | 12/2013 | Acar |
| 2015/0137806 A1 | 5/2015 | Wan et al. |

\* cited by examiner

METHOD AND STRUCTURE OF MEMS WLCSP FABRICATION

CROSS-REFERENCES TO RELATED APPLICATIONS

The present application claims priority to U.S. Provisional Patent Application No. 61/887,214, filed Oct. 4, 2013, commonly owned and incorporated by references herein. The present application incorporates by reference, for all purposes, the following pending patent applications: U.S. patent application Ser. No. 12/945,087, filed Nov. 12, 2010, and U.S. patent application Ser. No. 13/788,503, filed Mar. 7, 2013.

BACKGROUND OF THE INVENTION

The present invention is directed to MEMS (Micro-Electro-Mechanical-Systems). More specifically, embodiments of the invention provide methods and structure for improving integrated MEMS devices, including inertial sensors and the like.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such systems generally do not exist. These and other limitations of conventional MEMS and ICs may be further described throughout the present specification and more particularly below.

From the above, it is seen that techniques for improving fabrication techniques for IC devices and MEMS are highly desired.

BRIEF SUMMARY OF THE INVENTION

The present invention is directed to integrated MEMS (Micro-Electro-Mechanical-Systems) IC (Integrated Circuit) devices. More specifically, embodiments of the invention provide a method and structure for a MEMS WLCSP (Wafer Level Chip Scale Package) fabrication, including one or more discrete MEMS devices. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much greater range of applicability.

Embodiments of the present invention include a method and structure for fabricating a MEMS-IC device. The method can include receiving a CMOS substrate comprising a plurality of CMOS circuits and a first plurality of interconnection locations. This first plurality of interconnection locations can include a first set of locations and a second set of locations. The CMOS substrate also includes a surface portion on which the first set of locations is disposed. The method also includes receiving a MEMS substrate having at least one MEMS device. This MEMS substrate can also have a second plurality of interconnection locations including a third set of locations. The MEMS substrate can be coupled to the CMOS substrate such that the second set of locations is coupled to the third set of locations.

The MEMS substrate and the surface portion of the CMOS substrate can be encapsulated with a molding material, which forms a top surface. A first plurality of vias can be created in the molding material from the top surface to the surface portion of the CMOS substrate. The vias can be created by applying a laser drill to the molding material to thereby create the one or more vias from the top surface of the surface portion of the CMOS substrate. By creating these first vias, a portion of the first set of locations can be exposed. A conductive material can be disposed within the first plurality of vias such that the conductive material is electrically coupled to the first set of locations. A plurality of interconnects can be formed from the conductive material to the top surface of the molding material and a plurality of solder balls can be formed upon these interconnects.

In another embodiment, the method can include physically coupling an additional MEMS substrate to the MEMS substrate. The additional MEMS substrate can include an upper surface and a fourth set of locations. The MEMS substrate, the additional MEMS substrate, and the surface portion of the CMOS substrate can be encapsulated with a molding material, which can form a top surface. The molding material can include a plastic, a polymer, or an epoxy resin material, or the like and combinations thereof.

A first and second plurality of vias can be created in the molding material from the top surface. The first plurality of vias can be created from the top surface to the surface portion of the CMOS substrate, thereby exposing at least a portion of the first set of locations. The second plurality of vias can be created from the top surface to the upper surface of the additional MEMS substrate, thereby exposing at least a portion of the fourth set of locations. The vias can be created by applying a laser drill to the molding material to thereby create the one or more vias from the top surface of the surface portion of the CMOS substrate. Other drilling, etching, or mechanical processes and the like can be used to form the plurality of vias.

A conductive material can be disposed within both the first and second plurality of vias. The conductive material within the first plurality of vias can be electrically coupled to the first set of locations, while the conductive material within the second plurality of vias can be electrically coupled to the fourth set of locations. In a specific embodiment, the conductive material can include a metal material, a polymer material, an epoxy resin material, or the like and combinations thereof. The conductive material can include conductive inks made of copper or silver mixed with an epoxy resin, or other like conductive inks A plurality of interconnects can then be formed from the conductive material to the top surface of the molding material, and a plurality of solder balls can be formed upon these interconnects.

In various embodiments, additional MEMS substrates or dies can be stacked to form more complex and multifunctional integrated devices. In a specific embodiment, the additional MEMS substrate can be selected from a group consisting of a magnetic sensor, a gyroscope, and a pressure sensor, though other MEMS sensor devices can be used. The MEMS substrate can include a multi-axis accelerometer device or other multi-axis inertial sensor, or the like.

Many benefits are achieved by way of embodiments of the present invention over conventional techniques. The limitations of conventional wafer level wire bonding can be surpassed by using a wafer level laser drill, which can allow for stacked die configurations for integrated MEMS-IC devices. Additionally, the interconnects between device components can be enhanced by characteristics such as a larger contact area between copper (Cu) plating areas and RDLs. (Redistribution Layers). Depending upon the embodiment, one or more of these benefits may be achieved. These and other benefits will be described in more detail throughout the present specification and more particularly below.

Various additional objects, features, and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

The present invention is directed to integrated MEMS (Micro-Electro-Mechanical-Systems) IC (Integrated Circuit) devices. More specifically, embodiments of the invention provide a method and structure for a MEMS WLCSP (Wafer Level Chip Scale Package) fabrication, including one or more discrete MEMS devices. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much greater range of applicability.

The present application also incorporates by reference, for all purposes, the following pending patent applications: U.S. patent application Ser. No. 12/945,087, filed Nov. 12, 2010, and U.S. patent application Ser. No. 13/788,503, filed Mar. 7, 2013.

Figure 1A:
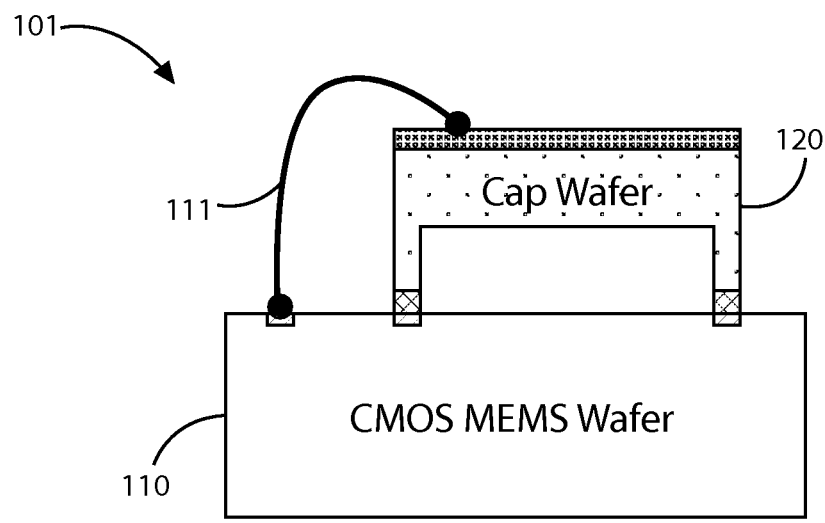
FIGS. 1A-1F are simplified diagrams illustrating a method for fabricating a MEMS-IC device according to an embodiment of the present invention.
Figure 1B:
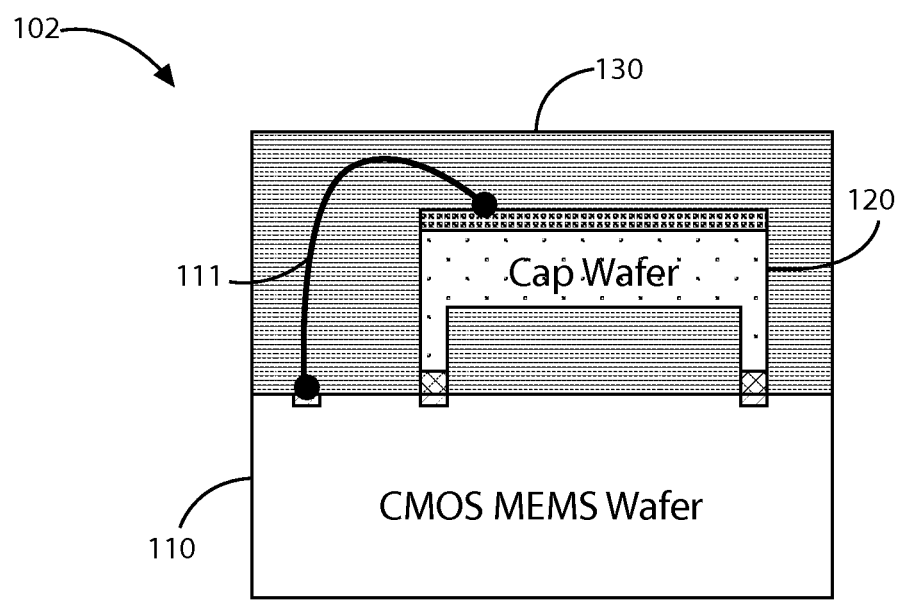
Figure 1C:
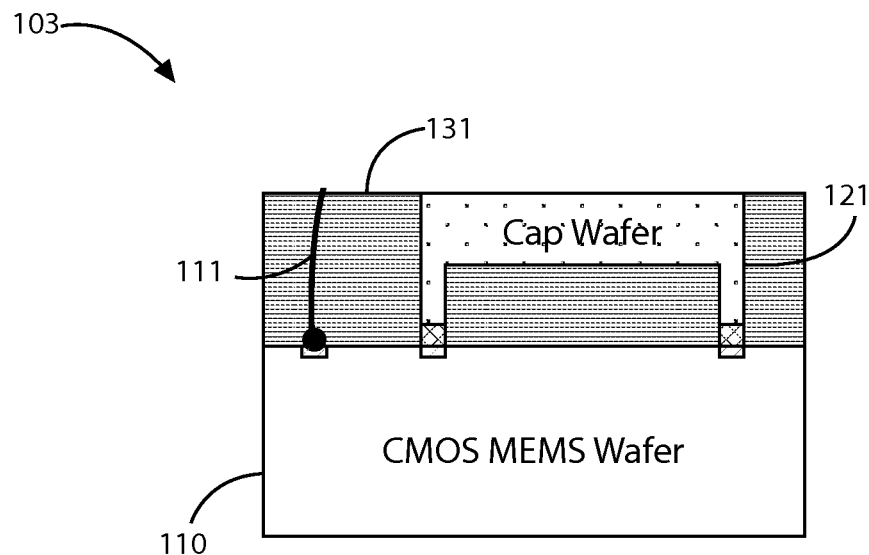

FIGS. 1A-1F are simplified diagrams illustrating a method for fabricating a MEMS-IC device according to an embodiment of the present invention. The method illustrated here depicts a MEMS-IC device undergoing a WLCSP process using wire bonding. Device 101 of FIG. 1A shows a wafer level wire bonding step in fabrication. A CMOS MEMS wafer 110 is shown with an encapsulation 120 or cap wafer formed overlying. A wire 111 is bonded to a contact point on the CMOS MEMS wafer 110 and a contact point on the upper surface of the cap wafer 120. Device 102 of FIG. 1B shows a wafer level molding step. A molding material 130 is formed overlying the CMOS MEMS wafer 110 and the cap wafer 120. Device 103 of FIG. 1C shows a step in which a portion of the molding 130 is removed to reveal the wire bond 111.

Figure 1D:
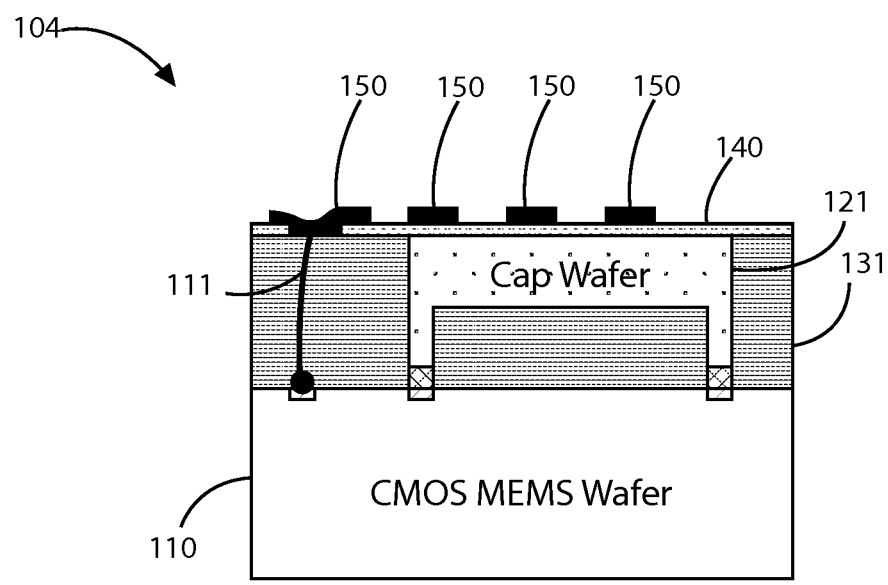
Figure 1E:
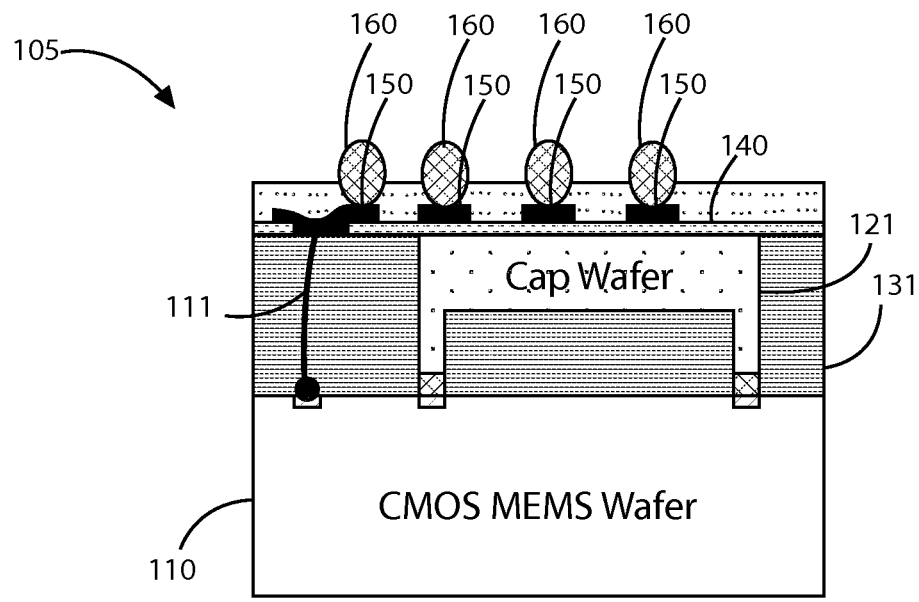
Figure 1F:
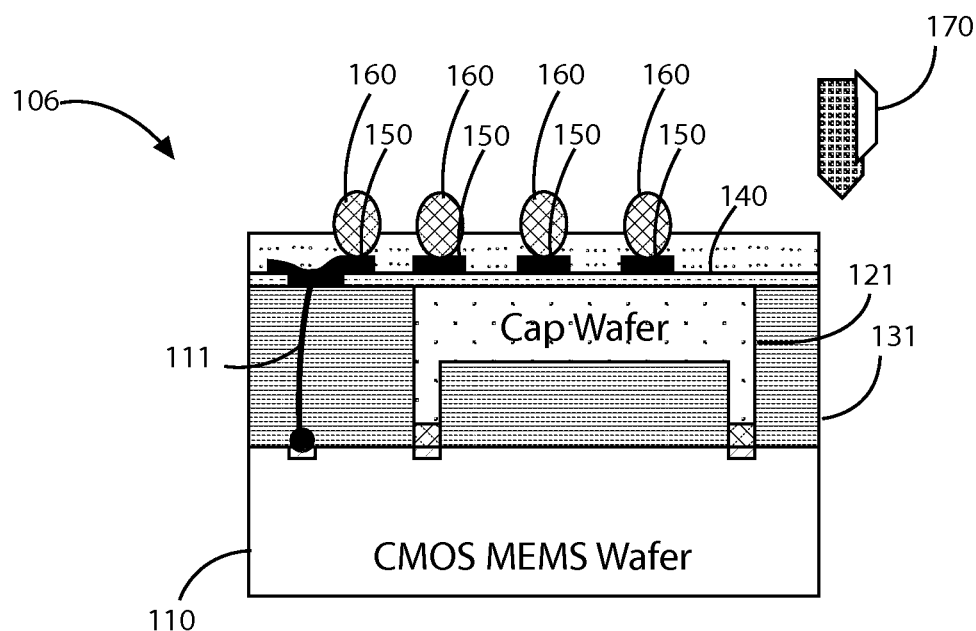

Device 104 of FIG. 1D shows a redistribution process step where a passivation layer 140 is formed overlying the cap 120 and the CMOS MEMS wafer 110 and the RDL (Redistribution Layer) 150 is used to relocate bond pad/contact points. Device 105 of FIG. 1E shows a solder ball placement process where solder balls 160 are formed overlying the RDL 150. In an embodiment, the device 105 can represent a sensor integrated on a single die. The sensor can include a 3-axis accelerometer, a 3-axis gyroscope, a 6-axis inertial sensor (3-axis accelerometer and 3-axis gyroscope), or the like. Device 106 of FIG. 1F shows a singulation process by a singulation mechanism 170.

Figure 2A:
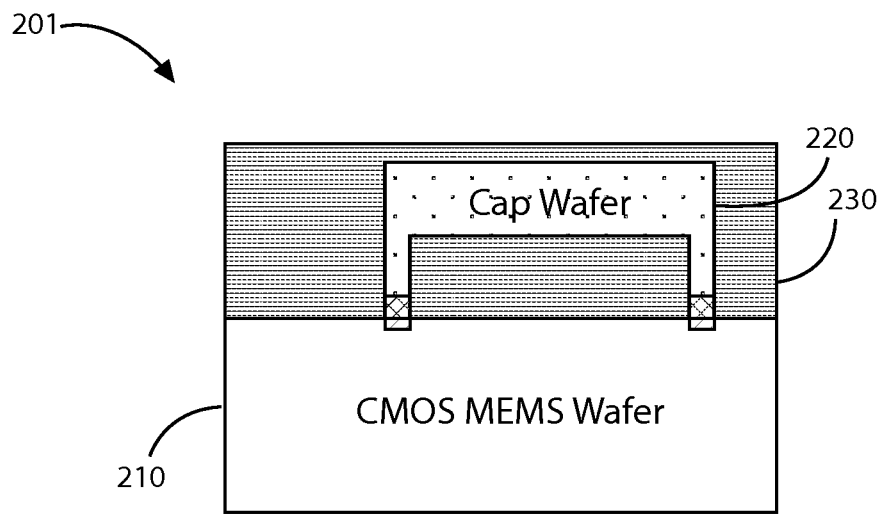
FIGS. 2A-2F are simplified diagrams illustrating a method for fabricating a MEMS-IC device according to an embodiment of the present invention.
Figure 2B:
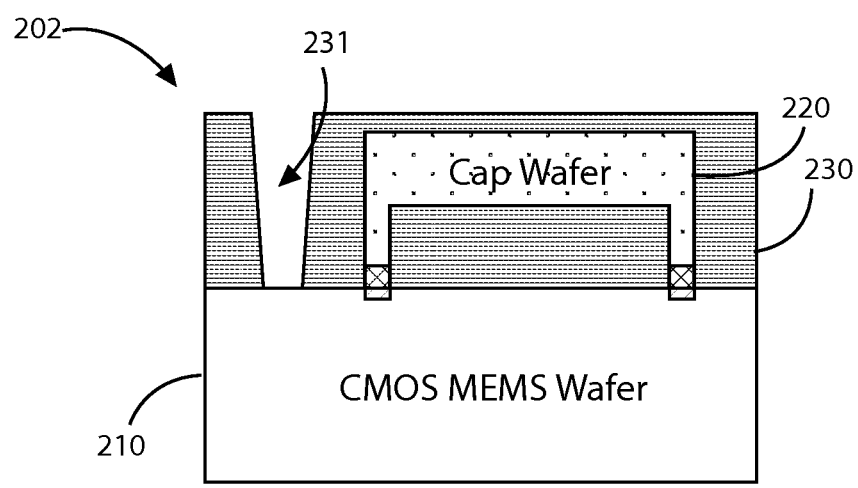
Figure 2C:
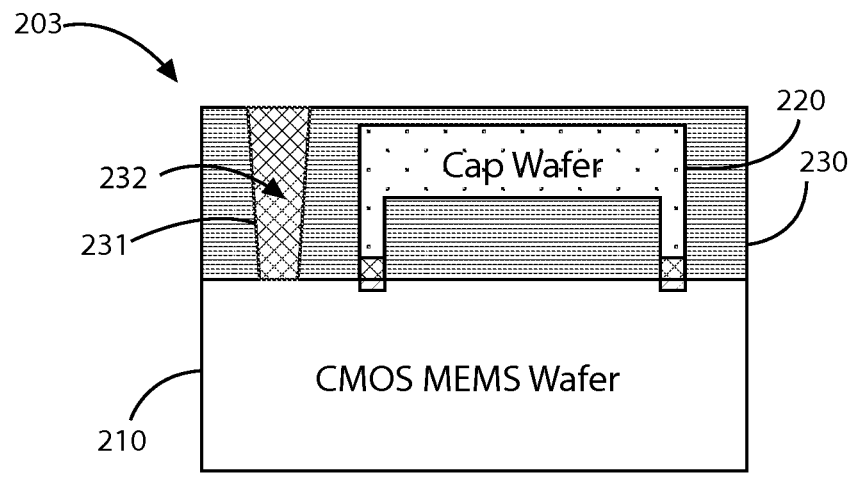
Figure 2D:
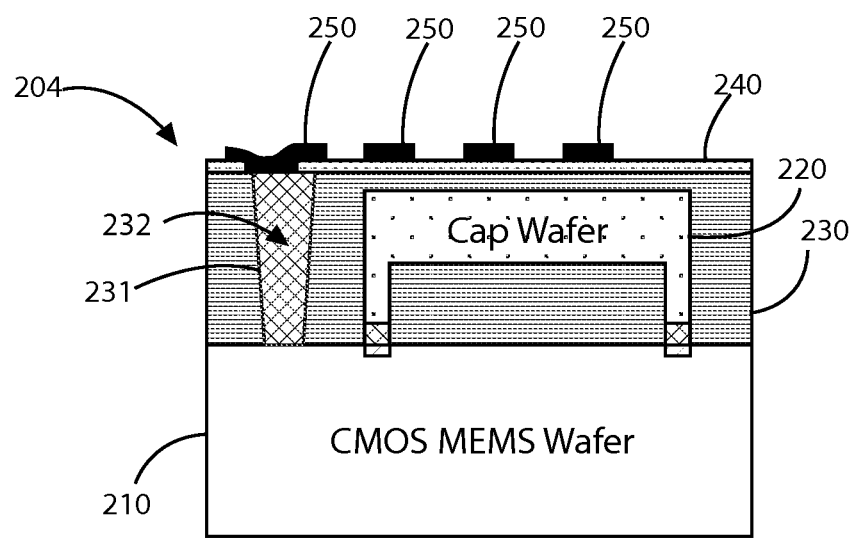
Figure 2E:
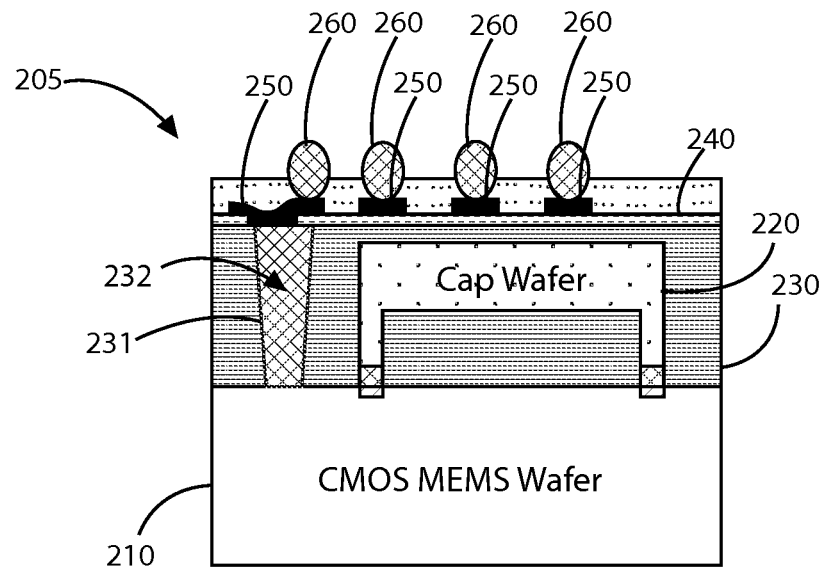
Figure 2F:
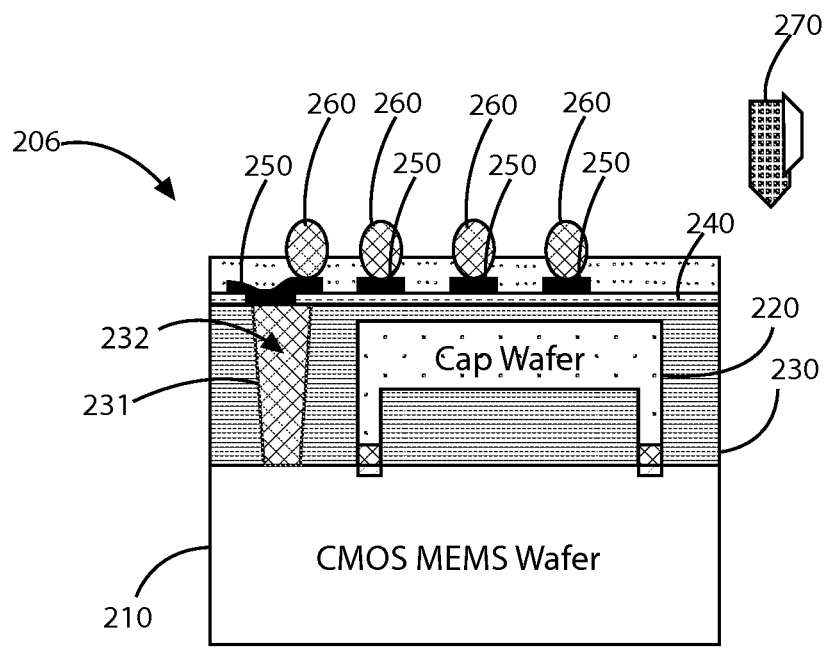

FIGS. 2A-2F are simplified diagrams illustrating a method for fabricating a MEMS-IC device according to an embodiment of the present invention. The method illustrated here depicts a MEMS-IC device undergoing a WLCSP process using a molding compound laser drilling. Device 201 of FIG. 2A shows a wafer level molding step. A molding material 230 is formed overlying the CMOS MEMS wafer 210 and the cap wafer 220. Device 202 of FIG. 2C shows a step in which a portion of the molding 130 is removed by a laser drilling process to form a via 331. Device 203 of FIG. 2C shows a via encapsulation step wherein the via 231 is filled with a conductive material 332. Device 204 of FIG. 2D shows a redistribution process step where a passivation layer 240 is formed overlying the cap 220 and the CMOS MEMS wafer 210 and the RDL (Redistribution Layer) 250 is used to relocate bond pad/contact points. Device 105 of FIG. 2E shows a solder ball placement process where solder balls 260 are formed overlying the RDL 250. Device 206 of FIG. 2F shows a singulation process by a singulation mechanism 270. Further details of this method are described in the flow diagram shown in FIG. 4.

Figure 3A:
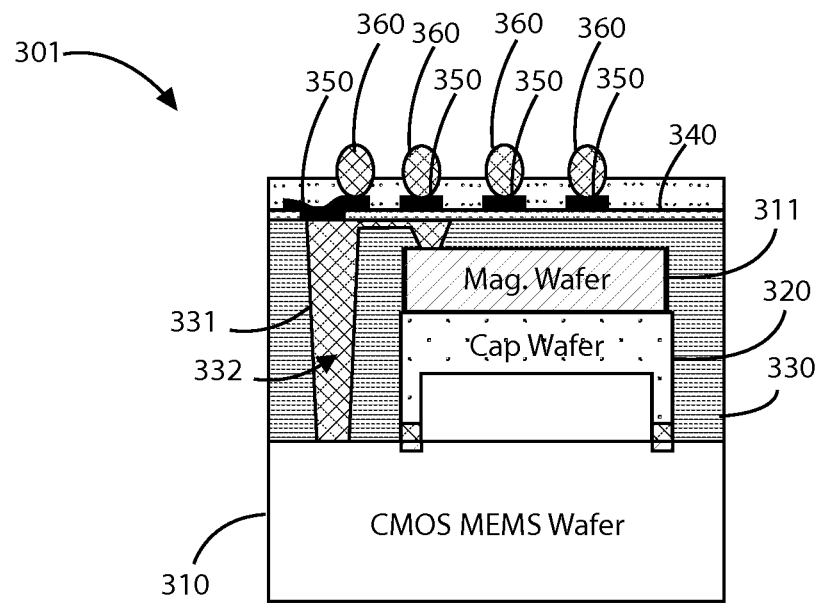
FIG. 3A is a simplified diagram of a stacked MEMS-IC device according to an embodiment of the present invention.

FIG. 3A is a simplified diagram of a stacked MEMS-IC device according to an embodiment of the present invention. In an embodiment, device 301 can be a 6 DOF (Degrees of Freedom) with a 3-axis magnetic sensor and a 3-axis accelerometer or a 3-axis gyroscope. In another embodiment, the device 301 can be a 9 DOF MEMS-IC device in a stacked configuration with a 3-axis accelerometer integrated with a 3-axis gyroscope and stacked with a 3-axis magnetic sensor. Here, the device 301 includes a CMOS-MEMS substrate 310 with a cap wafer 320 formed overlying. In an embodiment, the CMOS-MEMS substrate 310 can represent a sensor integrated on a single die. The sensor can include a 3-axis accelerometer, a 3-axis gyroscope, a 6-axis inertial sensor (3-axis accelerometer and 3-axis gyroscope), or the like. A 3-axis MEMS magnetic sensor or magnetic field sensor substrate 311 is coupled to the CMOS MEMS substrate 310 overlying the cap wafer 320. A molding 330 encapsulates the CMOS-MEMS substrate 310 and the magnetic sensor substrate 311. The molding includes one or more vias 331 within the molding 330 that include a conductive material 332 that electrically couples the CMOS MEMS substrate 310 to the magnetic sensor substrate 311 and the RDL 350 above. Similar to the packaging shown in previous figures, the RDL 350 overlies a passivation layer 340 and has solder balls 360 coupled to one or more portions of the RDL 350.

Figure 3B:
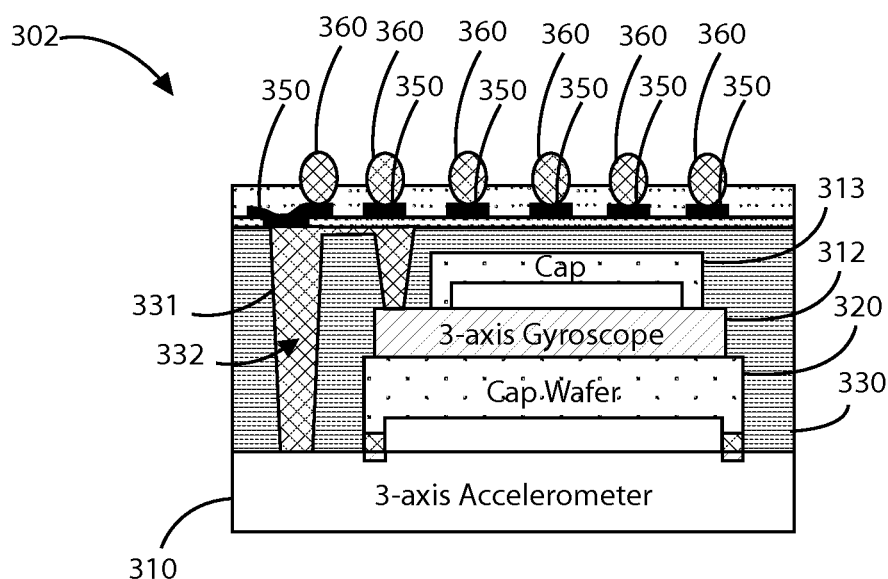
FIG. 3B is a simplified diagram of a stacked MEMS-IC device according to an embodiment of the present invention.

FIG. 3B is a simplified diagram of a stacked MEMS-IC device according to an embodiment of the present invention. As shown, device 302 depicts a 6 DOF (Degrees of Freedom) MEMS-IC device in a stacked configuration. Here, the device 301 includes a 3-axis accelerometer substrate 310 with an accelerometer cap wafer 320 formed overlying. A 3-axis gyroscope substrate 312, which has a gyro cap wafer 313, is coupled to the accelerometer substrate 310 overlying the accelerometer cap wafer 320. A molding 330 encapsulates the accelerometer substrate 310 and the gyro substrate 311. The molding includes one or more vias 331 within the molding 330 that include a conductive material 332 that electrically couples the accelerometer substrate 310 to the gyro substrate 311 and the RDL 350 above. Similar to the packaging shown in previous figures, the RDL 350 overlies a passivation layer 340 and has solder balls 360 coupled to one or more portions of the RDL 350.

Figure 3C:
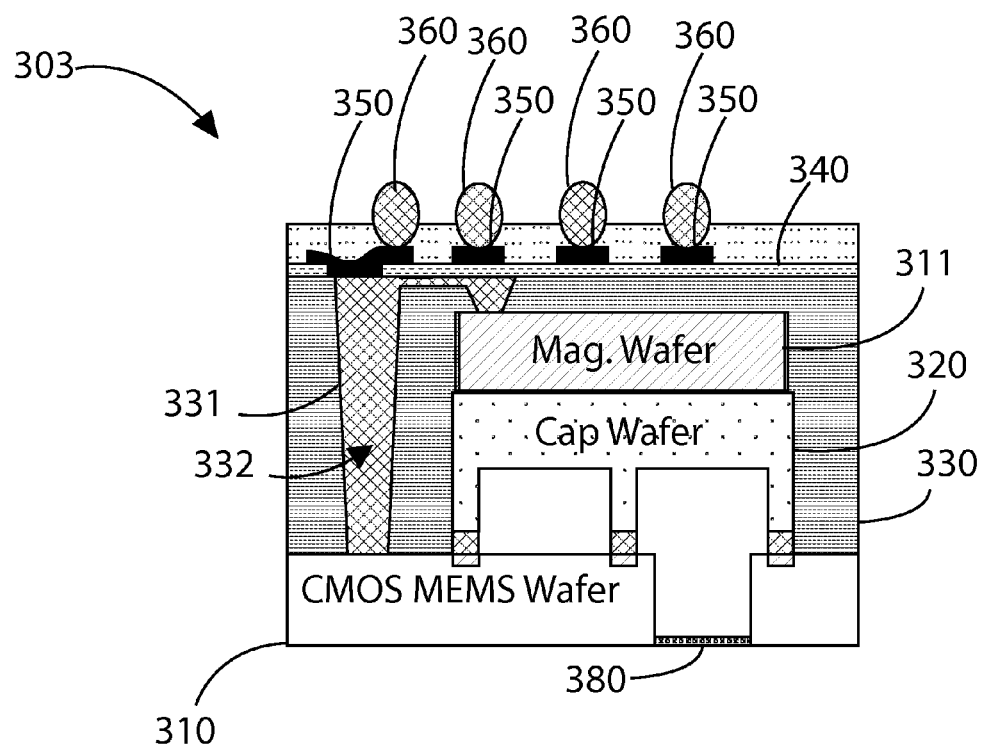
FIG. 3C is a simplified diagram of a stacked MEMS-IC device according to an embodiment of the present invention.

FIG. 3C is a simplified diagram of a stacked MEMS-IC device according to an embodiment of the present invention. As shown, device 303 depicts a 10 DOF (Degrees of Freedom) MEMS-IC device in a stacked configuration. Here, the device 303 includes a 6-axis CMOS-MEMS accelerometer/gyroscope substrate 310 with a cap wafer 320 formed overlying. A 3-axis MEMS magnetic sensor or magnetic field sensor substrate 311 is coupled to the 6-axis CMOS MEMS substrate 310 overlying the cap wafer 320. The CMOS-MEMS substrate 310 can also include a 1-axis pressure sensor 380 having a membrane structure, which is should in a separate enclosed cavity within the cap wafer 320. With the 6-axis accelerometer/gyroscope coupled to a 3-axis magnetic sensor and a 1-axis pressure sensor, the resulting device 303 is a 10 DOF integrated sensor device. A molding 330 encapsulates the 6-axis substrate 310 and the magnetic sensor substrate 311. The molding includes one or more vias 331 within the molding 330 that include a conductive material 332 that electrically couples the accelerometer CMOS MEMS substrate 310 to the magnetic sensor substrate 311 and the RDL 350 above. Similar to the packaging shown in previous figures, the RDL 350 overlies a passivation layer 340 and has solder balls 360 coupled to one or more portions of the RDL 350.

In an embodiment, the present invention provides a MEMS-IC device. The device can include a CMOS substrate comprising a plurality of CMOS circuits and a first plurality of interconnection locations. The first plurality of interconnection locations can include a first set of locations and a second set of locations. The CMOS substrate can include a surface portion whereupon the first set of locations is disposed. The device also includes a MEMS substrate disposed on the CMOS substrate. The MEMS substrate can include at least one MEMS device and a second plurality of interconnection locations. The second plurality of interconnection locations can include a third set of locations, which can be electrically coupled to the second set of locations of the first plurality of interconnections.

The device includes a molding material disposed upon the MEMS substrate and the surface portion of the CMOS substrate. The molding material can include a plastic, polymer, or epoxy resin material, and the like, or combinations thereof. The molding material forms a top surface can include a first plurality of vias from the top surface of the molding material to the surface portion of the CMOS substrate. The first plurality of vias includes a deposited conductive material such that the conductive material is electrically coupled to the first set of locations. The conductive material can include conductive inks made of copper or silver mixed with an epoxy resin, or other like conductive inks. The plurality of vias can be formed using a laser drill. A plurality of interconnects from the conductive material to the top surface of the molding material is also provided. In a specific embodiment, the plurality of interconnects can include a RDL coupled to the top surface of the molding material. The device can further include a plurality of solder balls disposed upon the plurality of interconnects.

In a specific embodiment, the device can a multiple MEMS stacked IC device, which includes an additional MEMS substrate coupled to the MEMS substrate. The additional MEMS substrate can include an upper surface and a fourth set of locations. The molding material can be disposed upon the additional MEMS substrate as well. In this case, the molding material includes a second plurality of vias from the top surface of the molding material to the upper surface of the additional MEMS substrate. The second plurality of vias can include the deposited conductive material such that it is coupled to the fourth set of locations. The conductive material can include conductive inks made of copper or silver mixed with an epoxy resin, or other like conductive inks. The MEMS substrate can be a multi-axis accelerometer and the additional MEMS substrate can be selected from a magnetic sensor, a gyroscope, a pressure sensor, or other like sensors. Examples of these embodiments are shown in FIGS. 3A and 3B.

Figure 4:
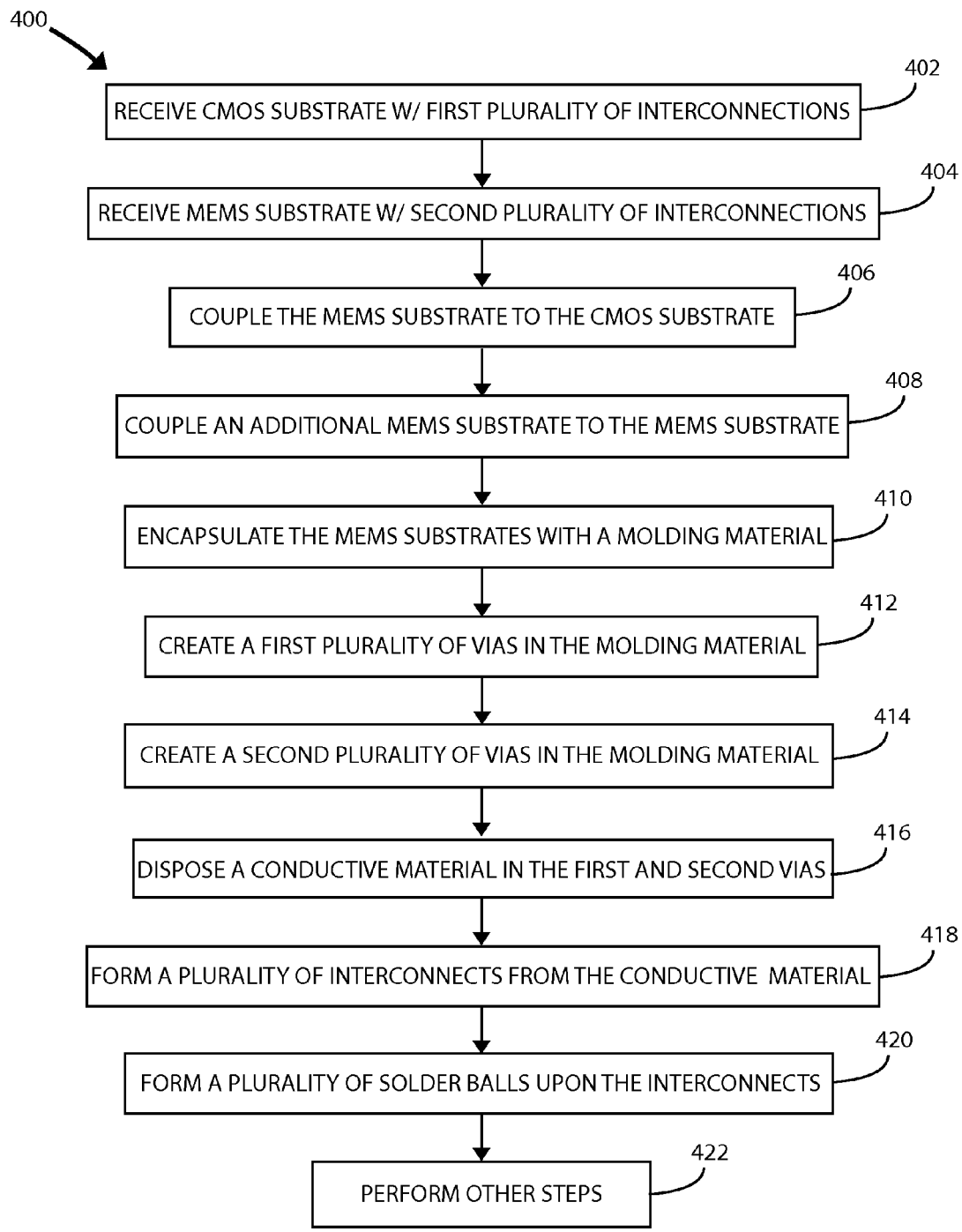
FIG. 4 is a simplified flow diagram of a method for fabricating a MEMS-IC device according to an embodiment of the present invention.

FIG. 4 is a simplified flow diagram of a method for fabricating a MEMS-IC device according to an embodiment of the present invention. As shown, the method 400 can include the following steps:

402. receive a CMOS substrate comprising a plurality of CMOS circuits and a first plurality of interconnection locations, wherein the first plurality of interconnection locations comprises a first set of locations and a second set of locations, wherein the CMOS substrate includes a surface portion, and wherein the first set of locations is disposed upon the surface portion;
404. receive a MEMS substrate comprising at least one MEMS device and a second plurality of interconnection locations comprising a third set of locations;
406. couple the MEMS substrate to the CMOS substrate such that the second set of locations are coupled to the third set of locations;
408. couple an additional MEMS substrate to the MEMS substrate, wherein the additional MEMS substrate comprises an upper surface and a fourth set of locations;
410. encapsulate the MEMS substrate, the additional MEMS substrate, and the surface portion of the CMOS substrate with a molding material, wherein the molding material forms a top surface;
412. create a first plurality of vias in the molding material from the top surface to the surface portion of the CMOS substrate, thereby exposing at least a portion of the first set of locations;
414. create a second plurality of vias in the molding materials from the top surface of the molding material to the upper surface of the additional MEMS substrate, thereby exposing at least a portion of the fourth set of locations;
416. dispose a conductive material in the first and second plurality of vias such that the conductive material is electrically coupled to the first and fourth set of locations through the respective plurality of vias;
418. form a plurality of interconnects from the conductive material to the top surface of the molding material;
420. form a plurality of solder balls upon the plurality of interconnects; and 422. Other steps as desired.

These steps are merely examples and should not unduly limit the scope of the claims herein. One of ordinary skill in the art would recognize many other variations, modifications, and alternatives. For example, various steps outlined above may be added, removed, modified, rearranged, repeated, and/or overlapped, as contemplated within the scope of the invention.

In an embodiment, the present invention provides a method of fabricating a MEMS-IC device. The method 400 can begin with receiving a CMOS substrate comprising a plurality of CMOS circuits and a first plurality of interconnection locations, step 402. This first plurality of interconnection locations can include a first set of locations and a second set of locations. The CMOS substrate also includes a surface portion on which the first set of locations is disposed. Method 400 also includes receiving a MEMS substrate having at least one MEMS device, step 404. This MEMS substrate can also have a second plurality of interconnection locations including a third set of locations. The MEMS substrate can be coupled to the CMOS substrate such that the second set of locations are coupled to the third set of locations, step 406.

In a specific embodiment, the fabricated MEMS-IC device can be a 3 DOF (Degrees Of Freedom) single MEMS device on a single die, which was illustrated in FIGS. 2A-2F. In this case, the MEMS substrate and the surface portion of the CMOS substrate can be encapsulated with a molding material, which forms a top surface. A first plurality of vias can be created in the molding material from the top surface to the surface portion of the CMOS substrate. The vias can be created by applying a laser drill to the molding material to thereby create the one or more vias from the top surface of the surface portion of the CMOS substrate. By creating these first vias, a portion of the first set of locations can be exposed. A conductive material can be disposed within the first plurality of vias such that the conductive material is electrically coupled to the first set of locations. A plurality of interconnects can be formed from the conductive material to the top surface of the molding material and a plurality of solder balls can be formed upon these interconnects.

In another embodiment, the method 400 can include physically coupling an additional MEMS substrate to the MEMS substrate, step 408. This embodiment can be similar to the 6 DOF stacked devices depicted in both FIGS. 3A and 3B. The additional MEMS substrate can include an upper surface and a fourth set of locations. The MEMS substrate, the additional MEMS substrate, and the surface portion of the CMOS substrate can be encapsulated with a molding material, step 410, which can form a top surface. The molding material can include a plastic, a polymer, or an epoxy resin material, or the like and combinations thereof.

A first and second plurality of vias can be created in the molding material from the top surface. The first plurality of vias can be created from the top surface to the surface portion of the CMOS substrate, step 412, thereby exposing at least a portion of the first set of locations. The second plurality of vias can be created from the top surface to the upper surface of the additional MEMS substrate, step 414, thereby exposing at least a portion of the fourth set of locations. The vias can be created by applying a laser drill to the molding material to thereby create the one or more vias from the top surface of the surface portion of the CMOS substrate. Other drilling, etching, or mechanical processes and the like can be used to form the plurality of vias. Those of ordinary skill in the art will recognize variations, modifications, and alternatives.

A conductive material can be disposed within both the first and second plurality of vias, step 416. The conductive material within the first plurality of vias can be electrically coupled to the first set of locations, while the conductive material within the second plurality of vias can be electrically coupled to the fourth set of locations. In a specific embodiment, the conductive material can include a metal material, a polymer material, an epoxy resin material, or the like and combinations thereof. The conductive material can include conductive inks made of copper or silver mixed with an epoxy resin, or other like conductive inks. A plurality of interconnects can then be formed from the conductive material to the top surface of the molding material, step 418, and a plurality of solder balls can be formed upon these interconnects, step 420.

In various embodiments, additional MEMS substrates or dies can be stacked to form more complex and multifunctional integrated devices. In a specific embodiment, the additional MEMS substrate can be selected from a group consisting of a magnetic sensor, a gyroscope, and a pressure sensor, though other MEMS sensor devices can be used. The MEMS substrate can include a multi-axis accelerometer device or other multi-axis inertial sensor, or the like. Other steps can be implemented as desired, step 422. By using embodiments of the method 400, the limitations of conventional wafer level wire bonding can be surpassed by using a wafer level laser drill. Additionally, the interconnects between device components can be enhanced by characteristics such as a larger contact area between copper (Cu) plating areas and RDLs. (Redistribution Layers).

Figure 5:
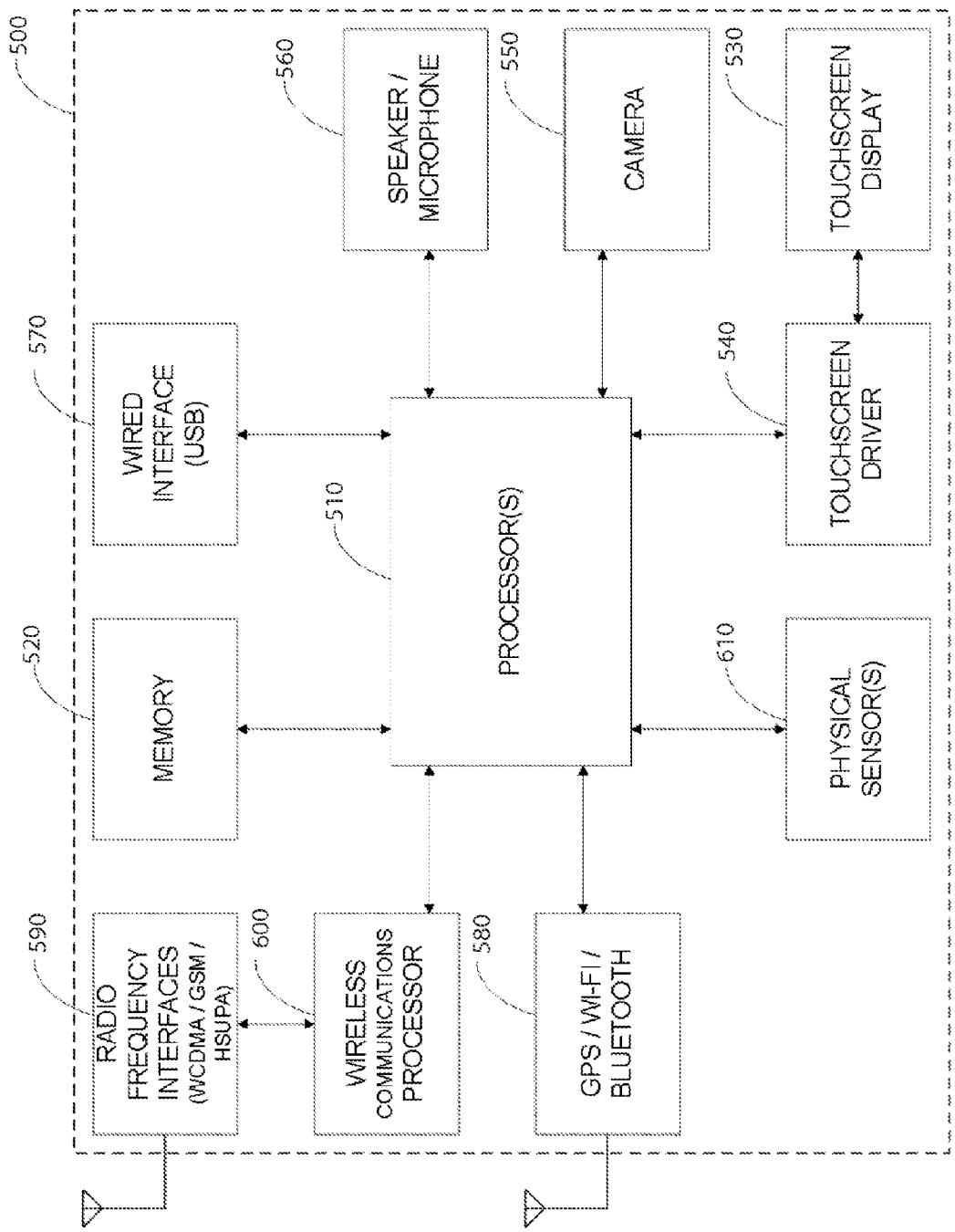
FIG. 5 illustrates a simplified functional block diagram of various embodiments of the present invention.

FIG. 5 illustrates a functional block diagram of various embodiments of the present invention. In FIG. 5, a computing device 500 typically includes an applications processor 510, memory 520, a touch screen display 530 and driver 540, an image acquisition device 550, audio input/output devices 560, and the like. Additional communications from and to computing device are typically provided by via a wired interface 570, a GPS/Wi-Fi/Bluetooth interface 580, RF interfaces 590 and driver 600, and the like. Also included in various embodiments are physical sensors 610.

In various embodiments, computing device 500 may be a hand-held computing device (e.g. Apple iPad, Apple iTouch, Dell Mini slate, Lenovo Skylight/IdeaPad, Asus EEE series, Microsoft Courier, Notion Ink Adam), a portable telephone (e.g. Apple iPhone, Motorola Droid, Google Nexus One, HTC Incredible/EVO 4G, Palm Pre series, Nokia N900), a portable computer (e.g. netbook, laptop), a media player (e.g. Microsoft Zune, Apple iPod), a reading device (e.g. Amazon Kindle, Barnes and Noble Nook), or the like.

Typically, computing device 500 may include one or more processors 510. Such processors 510 may also be termed application processors, and may include a processor core, a video/graphics core, and other cores. Processors 510 may be a processor from Apple (A4), Intel (Atom), NVidia (Tegra 2), Marvell (Armada), Qualcomm (Snapdragon), Samsung, TI (OMAP), or the like. In various embodiments, the processor core may be an Intel processor, an ARM Holdings processor such as the Cortex-A, -M, -R or ARM series processors, or the like. Further, in various embodiments, the video/graphics core may be an Imagination Technologies processor PowerVR-SGX, -MBX, -VGX graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 520 may include different types of memory (including memory controllers), such as flash memory (e.g. NOR, NAND), pseudo SRAM, DDR SDRAM, or the like. Memory 520 may be fixed within computing device 500 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, touch screen display 530 and driver 540 may be based upon a variety of later-developed or current touch screen technology including resistive displays, capacitive displays, optical sensor displays, electro-magnetic resonance, or the like. Additionally, touch screen display 530 may include single touch or multiple-touch sensing capability. Any later-developed or conventional output display technology may be used for the output display, such as TFT-LCD, OLED, Plasma, trans-reflective (Pixel Qi), electronic ink (e.g. electrophoretic, electrowetting, interferometric modulating). In various embodiments, the resolution of such displays and the resolution of such touch sensors may be set based upon engineering or non-engineering factors (e.g. sales, marketing). In some embodiments of the present invention, a display output port, such as an HDMI-based port or DVI-based port may also be included.

In some embodiments of the present invention, image capture device 550 may include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, or the like.

In various embodiments, audio input/output 560 may include conventional microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 510 to enable the user to operate computing device 500 by stating voice commands. Additionally, a speech engine may be provided in various embodiments to enable computing device 800 to provide audio status messages, audio response messages, or the like.

In various embodiments, wired interface 570 may be used to provide data transfers between computing device 500 and an external source, such as a computer, a remote server, a storage network, another computing device 500, or the like. Such data may include application data, operating system data, firmware, or the like. Embodiments may include any later-developed or conventional physical interface/protocol, such as: USB 2.0, 3.0, micro USB, mini USB, Firewire, Apple iPod connector, Ethernet, POTS, or the like. Additionally, software that enables communications over such networks is typically provided.

In various embodiments, a wireless interface 580 may also be provided to provide wireless data transfers between computing device 500 and external sources, such as computers, storage networks, headphones, microphones, cameras, or the like. As illustrated in FIG. 5, wireless protocols may include Wi-Fi (e.g. IEEE 802.11a/b/g/n, WiMax), Bluetooth, IR and the like.

GPS receiving capability may also be included in various embodiments of the present invention, however is not required. As illustrated in FIG. 5, GPS functionality is included as part of wireless interface 580 merely for sake of convenience, although in implementation, such functionality is currently performed by circuitry that is distinct from the Wi-Fi circuitry and distinct from the Bluetooth circuitry.

Additional wireless communications may be provided via RF interfaces 590 and drivers 600 in various embodiments. In various embodiments, RF interfaces 590 may support any future-developed or conventional radio frequency communications protocol, such as CDMA-based protocols (e.g. WCDMA), GSM-based protocols, HSUPA-based protocols, or the like. In the embodiments illustrated, driver 600 is illustrated as being distinct from applications processor 510. However, in some embodiments, these functionality are provided upon a single IC package, for example the Marvel PXA330 processor, and the like. It is contemplated that some embodiments of computing device 500 need not include the RF functionality provided by RF interface 590 and driver 600.

FIG. 5 also illustrates computing device 500 to include physical sensors 610. In various embodiments of the present invention, physical sensors 610 can be single axis or multi-axis Micro-Electro-Mechanical Systems (MEMS) based devices being developed by M-cube, the assignee of the present patent application. Physical sensors 610 can include accelerometers, gyroscopes, pressure sensors, magnetic field sensors, bio sensors, and the like. In other embodiments of the present invention, conventional physical sensors 610 from Bosch, STMicroelectronics, Analog Devices, Kionix or the like may be used.

In various embodiments, any number of future developed or current operating systems may be supported, such as iPhone OS (e.g. iOS), WindowsMobile (e.g. 7), Google Android (e.g. 2.2), Symbian, or the like. In various embodiments of the present invention, the operating system may be a multi-threaded multi-tasking operating system. Accordingly, inputs and/or outputs from and to touch screen display 530 and driver 540 and inputs/or outputs to physical sensors 610 may be processed in parallel processing threads. In other embodiments, such events or outputs may be processed serially, or the like. Inputs and outputs from other functional blocks may also be processed in parallel or serially, in other embodiments of the present invention, such as image acquisition device 550 and physical sensors 610.

FIG. 5 is representative of one computing or microprocessing device 500 capable of embodying the present invention. In one embodiment, the DOC can be implanted on chip with sensors instead of using an external processor. The previously described methods of operation can be implemented with on-chip logic or through a micro-processor in the same device or in a separate chip within the hand-held device. It will be readily apparent to one of ordinary skill in the art that many other hardware and software configurations are suitable for use with the present invention. Embodiments of the present invention may include at least some but need not include all of the functional blocks illustrated in FIG. 5. For example, in various embodiments, computing device 500 may lack image acquisition unit 550, or RF interface 590 and/or driver 600, or GPS capability, or the like. Additional functions may also be added to various embodiments of computing device 500, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a MEMS (Micro Electro Mechanical System) IC (Integrated Circuit) device comprising:
   receiving a CMOS substrate comprising a plurality of CMOS circuits and a first plurality of interconnection locations, wherein the first plurality of interconnection locations comprises a first set of locations and a second set of locations, wherein the CMOS substrate includes a surface portion, and wherein the first set of locations is disposed upon the surface portion;
   receiving a MEMS substrate comprising at least one MEMS device and a second plurality of interconnection locations comprising a third set of locations;
   coupling the MEMS substrate to the CMOS substrate such that the second set of locations are coupled to the third set of locations;
   encapsulating the MEMS substrate and the surface portion of the CMOS substrate with a molding material, wherein the molding material forms a top surface;
   creating a first plurality of vias in the molding material from the top surface to the surface portion of the CMOS substrate, thereby exposing at least a portion of the first set of locations;
   disposing a conductive material in the first plurality of vias such that the conductive material is electrically coupled to the first set of locations; and
   forming a plurality of interconnects from the conductive material to the top surface of the molding material.

2. The method of claim 1 further comprising forming a plurality of solder balls upon the plurality of interconnects.

3. The method of claim 1 wherein creating the first plurality of vias in the molding material comprises applying a laser drill to the molding material to thereby create the one or more vias from the top surface to the surface portion of the CMOS substrate.

4. The method of claim 1 wherein forming a plurality of interconnects comprises forming a RDL (Redistribution Layer) overlying top surface of the molding material.

5. The method of claim 1 wherein the encapsulating of the MEMS substrate and the surface portion of the CMOS substrate with a molding material comprises encapsulating the MEMS substrate and the surface portion of the CMOS substrate with a plastic material, a polymer material, or an epoxy resin material.

6. The method of claim 1 wherein the disposing of the conductive material in the first plurality of vias comprises disposing a copper material, a silver material, a polymer material, or an epoxy resin material.

7. The method of claim 1 further comprising
   physically coupling an additional MEMS substrate to the MEMS substrate, wherein the additional MEMS substrate comprises an upper surface and a fourth set of locations; and
   wherein encapsulating the MEMS substrate comprises encapsulating the MEMS substrate, the additional MEMS substrate, and the surface portion of the CMOS substrate with a molding material, wherein the molding material forms a top surface.

8. The method of claim 7 further comprising:
   creating a second plurality of vias in the molding material from the top surface of the molding material to the upper surface of the additional MEMS substrate, thereby exposing at least a portion of the fourth set of locations; and
   disposing the conductive material in the second plurality of vias such that the conductive material is electrically coupled to the fourth set of locations.

9. The method of claim 8 wherein the additional MEMS substrate is selected from a group consisting of: a magnetic sensor, a gyroscope, a pressure sensor.

10. The method of claim 8 wherein the MEMS substrate comprises a multi-axis accelerometer.

11. A method for fabricating a MEMS (Micro Electro Mechanical System) IC (Integrated Circuit) device comprising:
    receiving a CMOS substrate comprising a plurality of CMOS circuits and a first plurality of interconnection locations, wherein the first plurality of interconnection locations comprises a first set of locations and a second set of locations, wherein the CMOS substrate includes a surface portion, and wherein the first set of locations is disposed upon the surface portion;
    receiving a MEMS substrate comprising at least one MEMS device and a second plurality of interconnection locations comprising a third set of locations;
    coupling the MEMS substrate to the CMOS substrate such that the second set of locations are coupled to the third set of locations, and the first set of locations being exposed outside the MEMS substrate;

encapsulating the MEMS substrate and the surface portion of the CMOS substrate with a molding material, wherein the molding material forms a top surface;

creating a first plurality of vias in the molding material from the top surface to the surface portion of the CMOS substrate, thereby exposing at least a portion of the first set of locations;

disposing a conductive material in the first plurality of vias such that the conductive material is electrically coupled to the first set of locations; and forming a plurality of interconnects from the conductive material to the top surface of the molding material.

12. The method of claim 11 further comprising forming a plurality of solder balls upon the plurality of interconnects.

13. A method for fabricating a MEMS (Micro Electro Mechanical System) IC (Integrated Circuit) device comprising:

receiving a CMOS substrate comprising a plurality of CMOS circuits and a first plurality of interconnection locations, wherein the first plurality of interconnection locations comprises a first set of locations and a second set of locations, wherein the CMOS substrate includes a surface portion, and wherein the first set of locations is disposed upon the surface portion;

receiving a MEMS substrate comprising at least one MEMS device and a second plurality of interconnection locations comprising a third set of locations;

coupling the MEMS substrate to the CMOS substrate such that the second set of locations are electrically coupled to the third set of locations;

coupling at least one of the first set of locations to a contact point on top of the MEMS substrate using a wire;

encapsulating the MEMS substrate and the surface portion of the CMOS substrate with a molding material, wherein the molding material forms a top surface;

partially removing the molding material to expose the wire; and forming a plurality of interconnects overlying the molding material, at least one interconnect being coupled to the exposed wire.

14. The claim of 13, further comprising forming a plurality of solder balls upon the plurality of interconnects.

* * * * *